United States Patent [19]

Schnabl et al.

[11] 4,336,496
[45] Jun. 22, 1982

[54] ELECTRICAL CONTACT TEST APPARATUS TO TEST CONTACT RESISTANCE OF A SAMPLE TERMINAL

[75] Inventors: Rudolf Schnabl, Rodenbach; Helmut Becker, Hanau, both of Fed. Rep. of Germany

[73] Assignee: W. C. Heraeus GmbH, Hanau, Fed. Rep. of Germany

[21] Appl. No.: 193,176

[22] Filed: Oct. 1, 1980

[30] Foreign Application Priority Data

Oct. 2, 1979 [DE]  Fed. Rep. of Germany ....... 2939901

[51] Int. Cl.³ ............................................. G01R 31/22
[52] U.S. Cl. ............................. 324/158 P; 324/158 F
[58] Field of Search ................. 324/158 P, 158 F, 62, 324/421

[56] References Cited

U.S. PATENT DOCUMENTS

| | | | |
|---|---|---|---|
| 3,041,868 | 7/1962 | Schaschl et al. | 324/62 R X |
| 4,267,506 | 5/1981 | Shiell | 324/158 P |
| 4,267,507 | 5/1981 | Guerpont | 324/158 P |

FOREIGN PATENT DOCUMENTS 2813541  8/1979  Fed. Rep. of Germany ... 324/158 F

OTHER PUBLICATIONS

Croisier et al., Tester For Semiconductor Devices, IBM Technical Disclosure Bulletin, Nov. 1964, pp. 444, 445.
Schiff et al., Testing of Contact Conditions of Galvanically Deposited Layers, Metalloberflache, Oct. 1978, pp. 423-429.

*Primary Examiner*—Stanley T. Krawczewicz
*Attorney, Agent, or Firm*—Frishauf, Holtz, Goodman & Woodward

[57] ABSTRACT

To measure contact resistance between a probe and a terminal sample, and to insure gentle engagement of the probe on the sample, a scale beam is used which has an adjustable engagement weight, and which is lowered under control of a cam disk with an interposed magnetic system in which two magnets of equal polarity are placed adjacent each other so that, due to the repelling force of the two magnets, jolt-free, vibration-free engagement is possible, providing in effect a magnetic buffer. Preferably, the probe is a test wheel which, upon lowering from a raised position, can be disengaged from the drive motor which, when the test probe is off the sample terminal, rotates the wheel so that a fresh wheel surface is available for subsequent measurement. Engagement force can be controlled by suitable positioning of a counter weight, for example by a servo motor.

10 Claims, 7 Drawing Figures

ELECTRICAL CONTACT TEST APPARATUS TO TEST CONTACT RESISTANCE OF A SAMPLE TERMINAL

The present invention relates to a test apparatus, and more particularly to test electrical contacts with respect to contact resistance.

BACKGROUND AND PRIOR ART

Various types of contact test apparatus have been proposed; in one such apparatus, a contact element, typically a small wheel, is lowered on a surface of the sample terminal, the contact resistance of which is to be tested. To lower the test contact on the sample terminal, it has been proposed to drive an eccenter disk or a cam disk from an electric motor, in which a cam follower periodically is lifted off to likewise raise the test contact from the sample terminal, and then again to permit contacting the test contact on the test terminal at a different position. Such an apparatus is described, for example, in the journal "Metalloberfläche", year 32 (1978), issue 10, ("Metal Surfaces", article entitled "Testing of Contact Conditions of Galvanically Deposited Layers (I)", by K. L. Schiff and R. Schnabl). The test apparatus permits automatic test cycles with controllable contact force, controlled positioning of the test contact and prevention of stray deposition of corrosion products by the test contact.

Test apparatus of this type require above all precise and gentle positioning of the test contact on the surface to be tested or measured, that is, on the sample terminal. In order to provide for such positioning, the engagement speed of the test contact has been made adjustable, for example by utilizing a hydraulically, pneumatically or electro-dynamically operated scale system. The positioning speed of the test contact on the sample terminal could not readily be controlled in eccenter disk systems of the scale arrangement. Oscillations and vibrations during positioning of the movable test contact thus could be transferred onto the surface of the sample terminal.

THE INVENTION

It is an object to provide a test apparatus which retains the centricity and reliability of a mechanical positioning by means of a cam or eccenter disk for a scale beam and which, however, is so damped that the test contact can be placed on the sample terminal free from impacts, vibration and oscillation or relative sliding movement. Preferably, the arrangement should additionally lend itself to automated testing in programmed arrangement of various areas on the sample terminal.

Briefly, a replaceable plug-in holder is provided, electrically and mechanically connecting a test probe on a scale beam to permit interchange of test probes as desired. A connecting link is provided for soft engagement of the camming disk with the scale beam which, in accordance with a feature of the invention, includes in the link path a pair of magnets interposed between the cam follower and the engagement element for the scale beam, the magnets being so arranged that like poles are facing each other to provide a repelling force cushion between the cam follower and the engagement element, and hence gentle engagement of the probe contact on the sample upon tipping of the beam.

In accordance with a feature of the invention, the probe contact is a small wheel which is coupled to an engagement drive wheel located, when the scale beam is out of contact with the sample terminal, adjacent a small drive motor, for example a miniature motor, to rotate the probe contact wheel, so that a fresh surface on the probe contact wheel is available for a subsequent measuring cycle at a different location. The sample terminal, preferably, is located on a positioning table movable in a coordinate system, for example an x-y system, so that adjacent surface area portions of the sample terminal can be tested. When the probe contact wheel is in engagement with the sample terminal, the miniature motor is out-of-engagement with the probe so that the contact force with which the probe contact engages the test terminal is not falsified.

DRAWINGS

Figure 1:
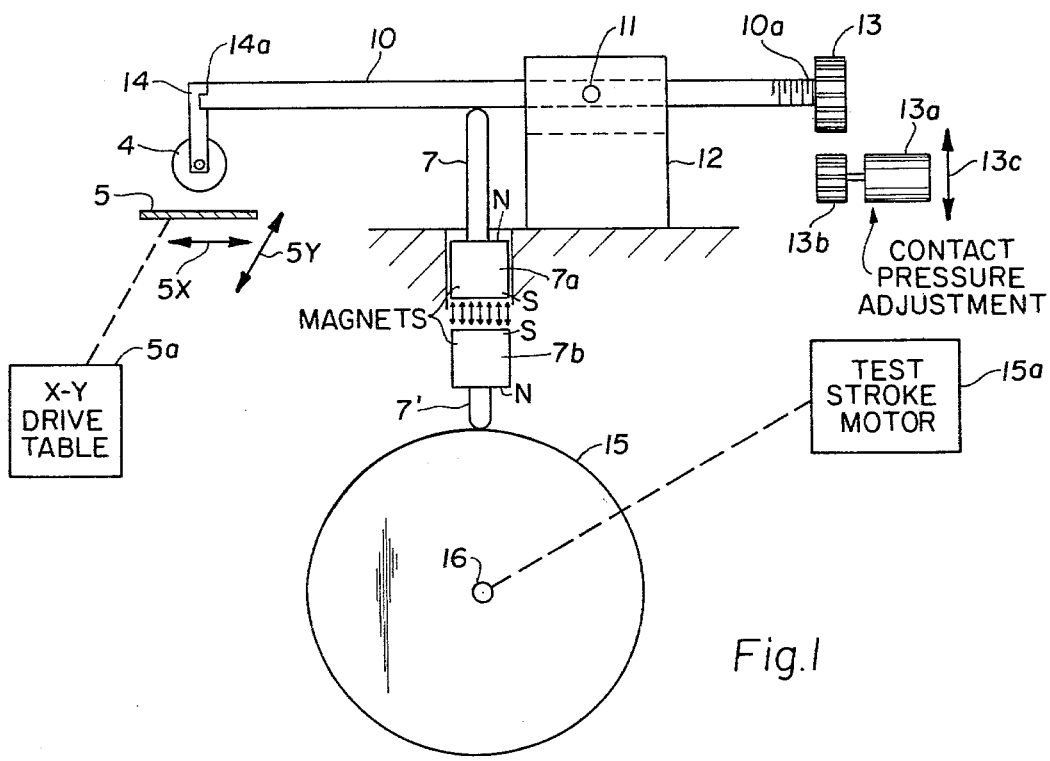
FIG. 1 is a general highly schematic side view of a scaling system illustrating a cam disk drive for transfer of force to a scale beam and hence to a probe contact wheel.

Referring first to FIGS. 1 and 2: A scale beam 10 is pivoted, as seen at 11, on a support 12. The pivot axis 11 is carefully made, so that the scale beam 10 can pivot freely, yet practically without play. The right end of the scale beam 10 is threaded and a counterweight 13 is placed thereon which, when rotated on the thread 10a, can be accurately adjusted with respect to the pivot point 11. The left end of the scale beam 10 is formed with a plug-in connection 14a for a carrier 14 for a probe contact 4.

The probe contact 4 is a replaceable element having an electrical contact as the actual sensor, in which the contact is in form of a small wheel, fitted on the carrier 14. The carrier 14 is replaceable and secured in the plug-in connection 14a to permit placement of various types of wheels 4 on a sample terminal 5. The connection 14a, preferably, is a plug-in unit customary with coaxial electrical terminals, providing both a mechanically stable and secure connection, free from play, as well as a secure electrical connection for two separate current conductors, insulated, both, with respect to ground or chassis of the apparatus. The output leads from the plug-in connection lead through the beam 10 and through suitable flexible connectors—not shown—to a measuring apparatus, which will be discussed below.

Positioning of the probe wheel 4 on the sample terminal 5 is controlled by moving the scale beam 10 towards and away from the sample terminal 5 under control of a cam disk 15. Cam disk 15 is rotated by a test stroke motor 15a. Motor 15a, preferably, is a d-c motor, for example a stepping motor, which can rotate the cam disk 15, journaled at a suitable support 16, over an angular range which can be accurately predetermined. As the disk 15 is rotated, a cam follower 7' is engaged thereby which, in turn, through a magnetic link, moves link element 7 to raise the scale beam 10, and hence the probe wheel 4 off the sample terminal 5, or permit lowering of probe 4 on the sample terminal 5. Force transfer from the cam disk 15 to the scale beam 10, in accordance with a feature of the invention, includes a magnetic link, formed by two permanent magnets of high coercitive force, and positioned in such a manner that like poles face each other, so that the poles are in opposition. Thus, any movement of the scale arm 10 will be damped by the magnetic field between the two magnets 7a, 7b in the linkage path of force transfer between the cam disk 15 and the scale beam 10. Consequently, the scale beam 10, and hence the probe wheel 4, will contact the test terminal 5 gently, without jolts or vibrations or displacement in a translatory direction with respect to the surface of sample terminal 5.

Automatic testing is simple if, in accordance with a feature of the invention, the cam disk 15 has markers applied thereto which indicate the angular displacement of the cam. As seen in FIG. 2, the side remote from the shaft 16 has permanent magnets 17 applied thereto, for example in the form of button magnets, which cooperate with a magnetic reed switch 20. The reed switch 20 is constructed in customary form and has a movable terminal 19 which, upon being subjected to the magnetic field from one of the magnets 17, moves towards a fixed terminal 18, to close an electrical connection. Closing of the reed switch 20 permits initiation of a measuring cycle. The reed switch 20 is connected to a sequencing circuit which, preferably, includes a microprocessor-controlled automatic sequencing system for controlling the sequence of a test cycle, such that when a certain position of cam disk 15 is indicated by closing of the contact 20, corresponding to a predetermined position of the scale beam 10, for example contact between the probe wheel 4 and the test terminal 5, a test sequence is initiated. If the material of the cam disk 15 is magnetically responsive, and the permanent magnets 17 are selected to be magnets of high coercitive force, so that they are self-sticking on the disk 15, the magnet 17 can be adjusted and placed in desired position, and, if desired, can be changed. Thus, both the number as well as the angular and radial position of the magnet can be selected for cooperation with one or more reed switches 20.

It is, then, possible to control from one cam disk a plurality of test probe wheels which, for example, are positioned in parallel on a common measuring array which, in turn, is secured to a sample holding table so that the respective probes can be sequentially energized or read out, or strobed to determine a measuring value and thus obtain test data of the respective contact resistances.

The sample terminal 5—see FIG. 1—preferably is secured to a table 5a which includes an X-Y drive, so that the sample 5 can be moved, respectively, in two perpendicular directions as schematically indicated by the arrows 5x and 5y.

If the test terminals 5 are of generally uniform size, the program for testing can be fixed. It is possible, however, also to change the distances between contact points between the probes 4 and the test terminals 5 by providing a manually controlled input unit. Positioning in the x direction preferably is controlled by an individual stepping motor which moves the X-Y drive 5a in predetermined steps. Likewise, a similar motion can be programmed for the Y direction.

Preferably, the y direction is controlled by an additional stepping motor or manually. If a stepping motor is used, it can be program-controlled. The drive, preferably, is a micrometer drive making only small steps. The program itself can be stored on a customary tape, magnetic or punched tape, as desired, in order to predetermine the measuring program. Storage and output can be obtained from the usual tape control drive and numerically controlled apparatus customary in machine tools and the like. The tape unit can be coupled to a microprocessor which, itself, is connected to the X-Y drive 5a, or a plurality of simultaneous tests on test terminals 5; or a plurality of test terminals 5 can be mounted on a single X-Y drive table 5a for simultaneous or sequential testing. The input unit, preferably, is so arranged that control is possible of the distance between successive sampling points as well as additional information, such as maximum current, voltage, and the like; as well as the number of individual sample measurements or probe measurements from any one particular point, single or multiple test points on any sample terminal, or the like; additionally, the displacement of the probe wheel 4 could be programmed—as will appear below.

The apparatus permits testing of terminals 5 of different surface shape or contour. To make such different tests, the holder 14, together with the test wheel 4, can be replaced by removal from the plug-in connection 14a with suitable different holders carrying different test wheels. The apparatus, likewise, permits testing of contact resistance with respect to materials of different characteristics, surface composition; of springs, rivets, wires, contact strips, rolled or extruded strips or the like.

The probe carrier 14 is coupled to the plug-in connection 14a by a mechanical and electrical connection. The probe carrier 14, thus, can carry probes of different shapes and characteristics. The probe 4 need not be a wheel; a pin, a test wire, or a contact button can be used as well. The plug-in connection 14a permits ready replacement of the probe carrier 14. By suitable selection of the probe 4, dimensions, distances from the test terminal 5 and the like can be easily maintained. The contact weight can be adjusted by rotation of the weight 13. The contact pressure adjustment can be effected automatically, for example by providing a small servo motor 13a, driving a pinion 13b which can be brought in and out of engagement with the adjustment wheel 13, the position of which on the threaded end 10a determines the engagement weight. Preferably, the motor 13a is movable in the direction of the double arrow 13c, interlocked—as will appear—with the program control so that it can be brought into engagement with the adjustment weight 13 only when the probe is raised off the test terminal 5.

In a preferred form, the contact probe 4 is a wheel which, after one or more measurements, is rotated by a few degrees in order to prevent carry-over of contamination or surface material from prior test points to a next one, and thus avoid false test results. The wheel 4 can easily be cleaned upon removal of carrier 14.

Figure 3:
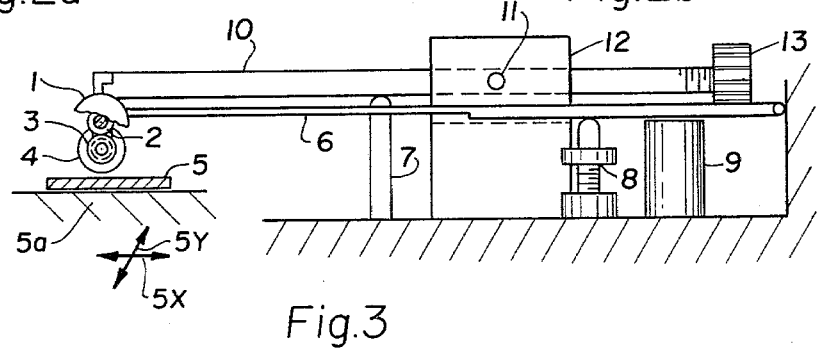
FIG. 3 is a fragmentary side view illustrating, specifically, the drive for the probe contact wheel, omitting the camming disk and the magnet positioning device.
Figure 4:
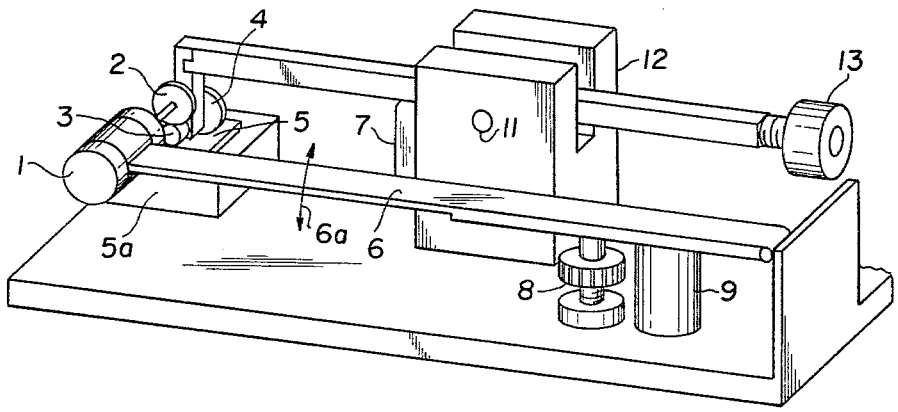
FIG. 4 is a perspective view of the apparatus of FIG. 3.

In accordance with a feature of the invention, the wheel 4 can be rotated by an electric drive. Referring to FIGS. 3 and 4: A miniature motor, typically a d-c motor 1, is resiliently suspended on a carrier arm 6. Carrier arm 6, preferably, is a spring made of magnetic spring steel. Carrier arm 6, preferably, can be moved laterally (see arrow 6a) relatively to the frame 12 on which the beam 11 is pivoted. A magnet 9 is provided, holding the spring 6 in aligned position. An adjustment screw 8 can be used as a pedestal for the spring 6. The adjustment screw 8, preferably, is spherical at its end (see FIG. 3) to provide a low-friction seating.

The probe wheel 4 is journaled on a side of the carrier 14 and is supplied with a counter wheel 3 at the opposite side of the carrier, and on a common shaft. The counter wheel 3 can be brought into engagement with a pinion 2, secured to, or driven by the shaft of the miniature motor 1. The motor is so positioned that, when the probe wheel 4 is lowered into engagement with the test terminal 5, the pinion 2 will be out of engagement with the counter wheel 3. When the link 7 lifts the beam 10, counter wheel 3 resiliently engages the pinion 2 coupled to the motor 1 which rotates the wheel 3, and hence the probe wheel 4, by a few degrees. The drive pulse to adjust the angle of rotation over which the wheel 4 is driven will control the angle through which the probe 4 will move. Hence, by controlling the length of the pulse, the motion of the wheel 4 can be controlled. As the beam 10 is lowered, the wheel 4 and its counter wheel 3 will come free from engagement with the drive pinion 2 coupled to the motor 1. Only the force of contact engagement, set by adjustment of the position of counter weight 13, and the weight of the carrier 14, probe 4 and counter wheel 3 will then be effective in determining the contact engagement force. Other ways of setting the engagement force than a counter weight 13 may be used, for example a solenoid with a plunger, the force of which can be controlled by controlling current flow through the solenoid, spring force, or the like.

Figure 5:
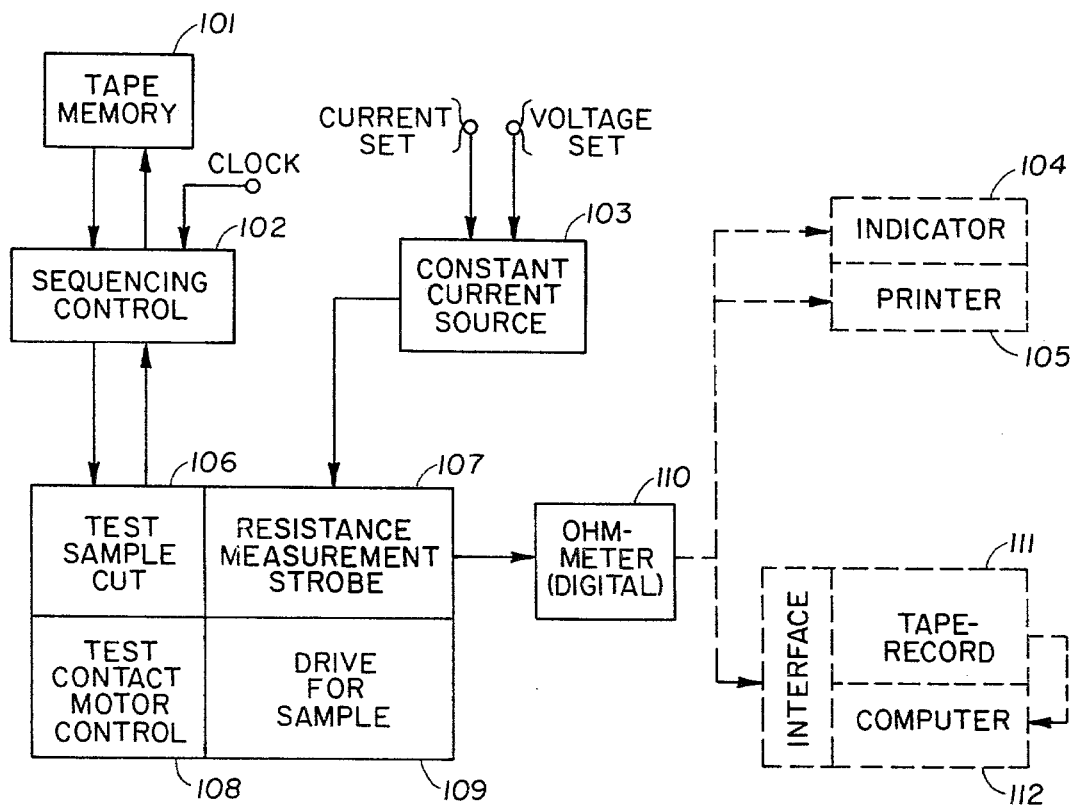
FIG. 5 is a block diagram of an automated sequencing system for automatic testing of various discrete surface areas of a sample terminal.
Figure 6:
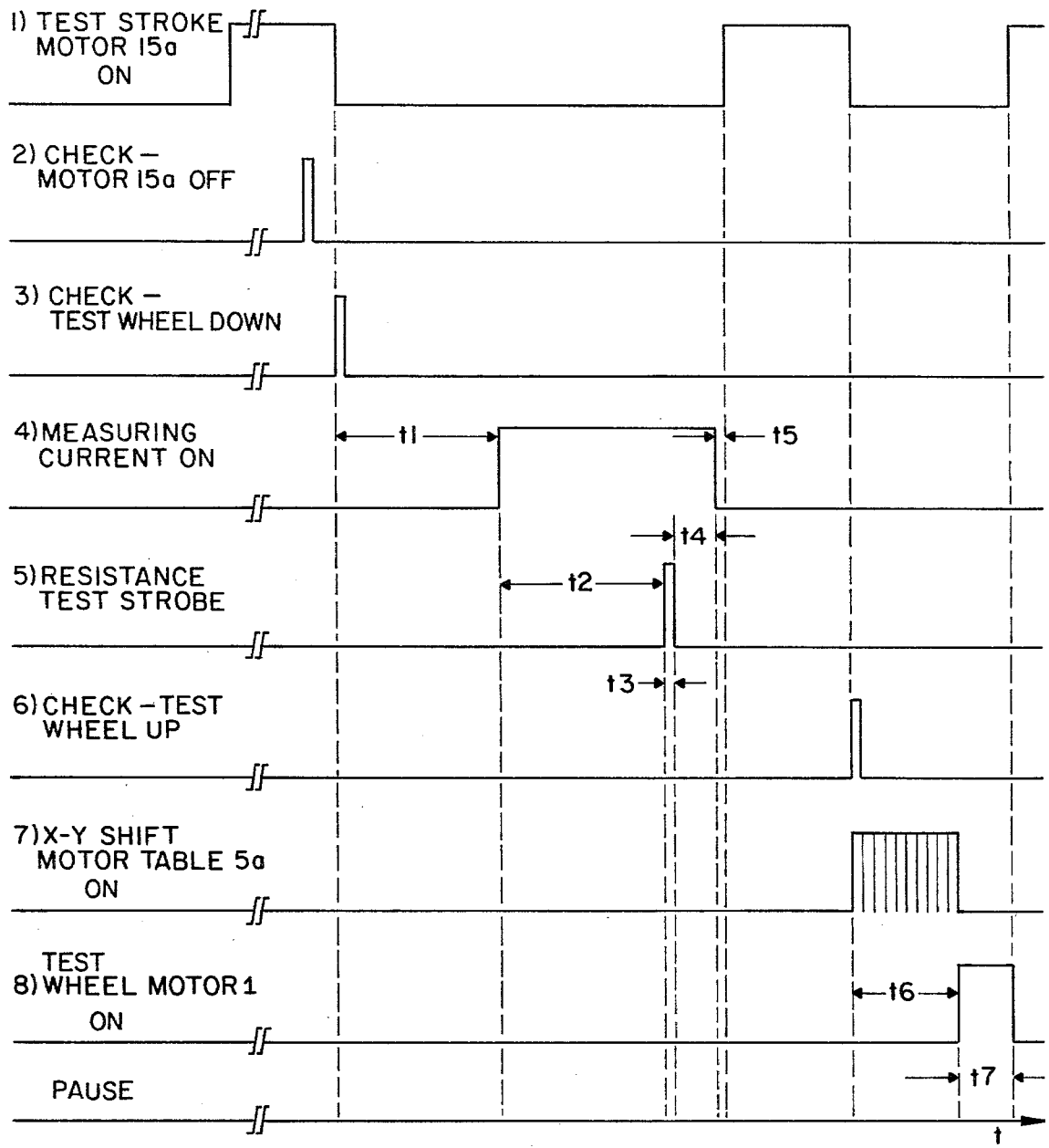
FIG. 6 is a timing diagram illustrating the various operations which can be carried out by the apparatus when in an automatic mode.

Operation, with reference to FIGS. 5 and 6: Preferably, the test program is stored on magnetic or punched tape, and can be transferred for automatic run-through to a buffer memory. The buffer memory—not shown—then can be interrogated by a sequencing unit, preferably a microprocessor.

FIG. 5 illustrates a tape memory 101, connected to a microprocessor 102 which may have a clock input and at least one output—for purposes described best below especially for test sequencing—connected with interface 106. The microprocessor 102 controls a test stroke motor drive 15 as well as a test contact or probe wheel motor 1 (FIGS. 3, 4), and drive motors 5a for x-y shift of sample holder table (FIG. 1). The microprocessor 102 also can be connected if desired, for example to adjust the position of counter weight 13, that is, motor 13a. The microprocessor 102 also controls the strobe or scanning pulse for resistance measurement, to occur at a period of time intermediate the total dwell time of the probe 4 on the sample terminal 5. A constant current source (1 or 10 mA) 103 is controlled by a current set input. The voltage drop is sensed in a digital volt meter 110, the output of which then can be converted into ohms (U/I) and then indicated and/or recorded and stored. Generally, control 108 can be used to carry out various functions.

Before contact resistance measurement, electric motoric forces, which may falsify the measurement, can be measured and eliminated by microprocessor programming.

The initial position of the X-Y table, as well as initial balancing of the balance scale, that is, the beam 10 with the respective probe carrier 14 and the probe 4 thereon, is done by adjusting it manually with common adjusting means such as weights. The range of loading of the test probe 4 on the terminal 5 can be, for example, between 2 and 200 cN, without, however, being limited to this weight relationship. The range is usually suitable for testing of electronic contact strips. Adjustment of the probe 4 towards the sample terminal 5 also can be controlled by positioning of the magnets 7a, 7b on the respective cam follower 7' or link 7, so that the beam 10, and the probe wheel 4 thereon, will be lowered gently and without jolt on the test terminal 5.

Sequencing of a test—with reference to FIG. 6: The first step is energization of the test stroke motor 15a to rotate cam 15 to a position to lower probe wheel 4 on the sample terminal 15. Before this step is completed, a check pulse is emitted—see line 2 of FIG. 6—to obtain feedback information that everything is proceeding correctly. The position of the test wheel is checked—see line 3 of FIG. 6—and if this pulse is properly sensed, testing can commence.

The test current itself is determined by test conditions which, in general, will be in accordance with standards established by government or industry, for example according to German industry standard DIN 41 640, insofar as they relate to electrical measuring of contact resistance. In accordance with this test, a maximum d-c voltage of 15 millivolts is used. A test current is selected of from between 1 to 10 mA—as determined by the "current set" input to constant current source 103.

The voltage drop between test probe 4 and the sample terminal 5 is measured in a high input resistance digital volt meter. The output from the digital volt meter can be classified in unit 104, printed in a printer 105, recorded on a tape record or punch tape memory 111 or further processed in a computer 112. The tape record unit 111 and the computer 112 can be the same element as the tape memory 101 and microprocessor 102, and control of the recording can likewise be under the sequencing control of microprocessor 102.

After the check that the test wheel is down has been performed, a suitable time is permitted to elapse, indicated as t1—line 4 of FIG. 6—and the test current is then connected by energizing the constant current source 103. Some time after the initial connection, that is, after a period t2, a strobe pulse which is short with respect to the overall test current pulse, having a time t3, is provided, at which time the volt meter 110 is connected to read the resistance. Some further time t4 is permitted to elapse, and the test current is then disconnected. Upon disconnection of the test current, the test stroke motor 15a is again energized, which rotates the cam disk 15 and thus lifts the probe 4 off the sample. For safety, a short interval t5 is provided to be sure that the test current is disconnected before the probe is lifted off the terminal. A check pulse that the test wheel 4 is in up condition, is emitted—line 6 of FIG. 6—and thereafter the X-Y shift motor 5a, controlling the X-Y table, is energized for a suitable number of steps, as programmed, time t6. The wheel motor 1 is energized by a pulse for the time period t7—see line 8 of FIG. 6—in order to rotate the probe wheel 4 over a predetermined angle so that, upon the next energization of the test stroke motor 15a—which will lower the wheel on the sample—the sample will have been repositioned by the X-Y motor—see line 7 of FIG. 6—and the wheel likewise will present a fresh surface to the new test area—see line 8 of FIG. 6.

Figures 2A, 2B:
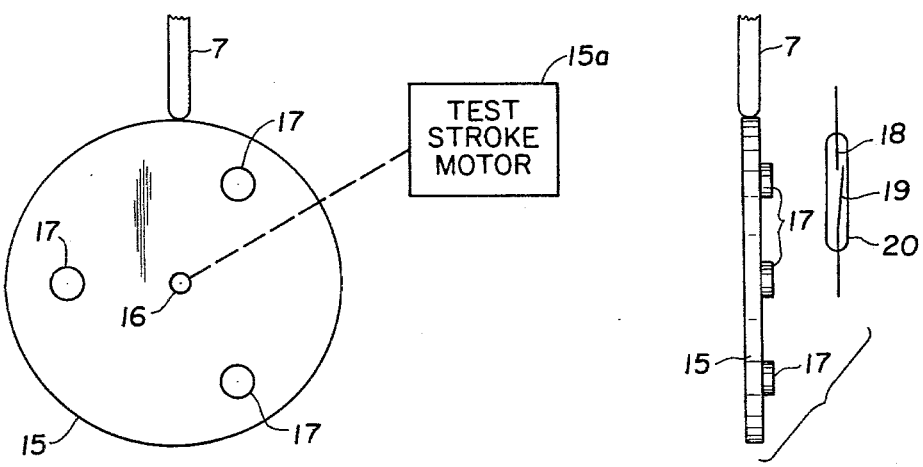
FIG. 2a shows the cam disk and associated positioning means to permit control of cycles by a program control unit, for example a microprocessor, for sequential positioning of the probe contact on different surface areas of the test terminal.
FIG. 2b is a side view of the arrangement of FIG. 2a, in schematic form.

The duration of the energization of the test stroke motor 15a need not be controlled by the microprocessor, since control of the position of stopping of the test stroke motor can be effected by the permanent magnet 17 and the associated reed contacts—see FIGS. 2a, 2b.

The control for the stepping motors for the X-Y table is not described in detail since any standard and well known and commercially available unit may be used. Such positioning systems together with feedback systems to insure that the proper position has been reached and provide suitable check pulses are well known and commercial articles.

Various changes and modifications may be made, and any features specifically described can be used in connection with known test sampling apparatus. Position feedback sensors also have been omitted. They can be used, as well known, for example, to generate or control check pulses.

We claim:

1. Electrical contact material test apparatus to test contact resistance of a sample (5) having
   a sample carrier (5a) on which the sample (5) is placed;
   a scale beam (10) defining two scale arms, a probe (4) positioned at one end of one of the scale arms and located in alignment with the sample carrier;
   a balance counter weight (13) positioned on the other scale arm to determine the contact pressure between the probe (4) and the sample (5) when the probe is in engagement with the sample;
   a test stroke operating means (15, 15a, 16) including a rotatable camming disk (15) engageable with a scale beam (10) and rotatable to selectively lift the test beam off the sample, and permit engagement of the test probe with the sample with the contact pressure determined by said balance counter weight when the beam is permitted to drop,
   comprising, in accordance with the invention,
   a connecting link (7, 7a, 7b, 7') for soft engagement of the camming disk (15) with the scale beam (10) including a cam follower (7') in engagement with the camming disk, an engagement element (7) in engagement with the scale beam, and a pair of magnets (7a, 7b) interposed between the cam follower and the engagement element having like poles facing each other to provide a repelling force cushion between the cam follower and the engagement element and hence gentle engagement of the probe (4) on the sample (5) upon rotation of the disk controlling tipping of the beam.

2. Apparatus according to claim 1, further including a replaceable plug-in holder (14) electrically and mechanically connecting the test probe (4) to the scale beam (10) to permit interchange of test probes and secure attachment to the scale beam of a selected probe.

3. Apparatus according to claim 1, wherein the probe (4) comprises a wheel;
   and means are provided to rotate the wheel between test cycles comprising
   a probe positioning motor (1);
   a motor support means (6, 8, 9) supporting the motor in position adjacent the probe wheel (4) when the probe is out of contact with the sample (5) by the scale beam being lifted, and the probe lifted off the sample upon rotation of the camming disk (15), and means (2, 3) coupling the probe motor to the probe wheel (4) to rotate the probe wheel and change the engagement position of the probe wheel with the sample upon a subsequent measuring engagement with the sample and thereby present a fresh probe area to the sample upon subsequent measuring engagement.

4. Apparatus according to claim 3, wherein the motor support means comprises a strip of magnetic spring steel, and the probe positioning motor is a miniature motor, suspended at a free end of the spring steel strip for resilient engagement of the engagement means with the probe wheel when the probe wheel (4) is lifted off the sample (5), and disengagement from the probe wheel to result in the contact force between the probe wheel and the sample being determined solely by said counter weight (13).

5. Apparatus according to claim 1, wherein said other scale arm has a threaded end (10a), the counter weight (13) being rotatable on said threaded end;
   and a spindle drive (13a, 13b, 13c) engageable with the counter weight to position the counter weight at a predetermined balance position on said other scale arm.

6. Apparatus according to claim 4, wherein the motor support means further comprises a support post (6) engageable with said magnetic spring strip supporting the probe positioning motor (1); and magnetic means (9) positioning the spring strip parallel to the scale beam, but permitting out-of-parallel positioning thereof by pivoting about said post and thereby permit removal of the probe positioning motor and the engagement means from adjacent position to the probe (4).

7. Apparatus according to claim 6, wherein the magnetic means comprises a permanent magnet (9) acting on said strip spring.

8. Automatic test system to test sequential samples (5) or sequential areas of a sample for contact resistance
   comprising the apparatus of claim 1 or 2 or 3 or 5 or 6 or 7
   and further including
   memory means (101) storing a sequence of test steps;
   a sequencing microprocessor (102) connected to and controlled by the memory means (101);
   a constant current source (103) connected to said probe (4);
   an ohm meter (110) connected to said probe;
   said sequencing microprocessor (102) controlling rotation of said camming disk drive (15) and, after engagement of the probe (4) and the sample (5), application of a constant current from said constant current source (103) through the sample and, in the time interval (t2+t3+t4) of current flow, read-out of the contact resistance by said ohm meter (110); and
   means (104, 105, 111, 112) storing the thus read-out resistance value;
   said sequencing microprocessor thereafter controlling said test stroke operating means to move and lift the probe (4) off the sample (5).

9. System according to claim 8, wherein the sample carrier (5a) comprises an X-Y drive positioning table including at least one stepping motor moving the table in either coordinate x or y direction, connected to and controlled by said sequencing microprocessor (102) to move the table for a predetermined period of time (t6) through a predetermined number of steps after the probe (4) has been lifted off the sample (5).

10. System according to claim 8, wherein the camming disk (15) includes magnetic means (17) selectively, circumferentially positionable along the camming disk; and magnetically responsive switch means (18, 19, 20) located in magnetic interacting relationship with respect to said magnetic means (17) and connected to said sequencing microprocessor (102) to signal the angular position of said camming disk to the sequencing microprocessor to control initiation of sequence and the respective sequencing operations thereof.

* * * * *